(12) United States Patent
Wu et al.

(10) Patent No.: US 9,389,655 B2
(45) Date of Patent: Jul. 12, 2016

(54) ELECTRONIC DEVICE HAVING FAN MODULE WITH REINFORCING STRUCTURE

(71) Applicants: Hsin-Yi Wu, Taipei (TW); Ming-Wang Lin, Taipei (TW); Hui-Lian Chang, Taipei (TW); Hsin-An Shu, Taipei (TW); Pan-Jen Chen, Taipei (TW); Jia-Rung Tsai, Taipei (TW); Yi-Hsiang Hung, Taipei (TW)

(72) Inventors: Hsin-Yi Wu, Taipei (TW); Ming-Wang Lin, Taipei (TW); Hui-Lian Chang, Taipei (TW); Hsin-An Shu, Taipei (TW); Pan-Jen Chen, Taipei (TW); Jia-Rung Tsai, Taipei (TW); Yi-Hsiang Hung, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 230 days.

(21) Appl. No.: 14/092,931

(22) Filed: Nov. 28, 2013

(65) Prior Publication Data

US 2014/0177173 A1    Jun. 26, 2014

Related U.S. Application Data

(60) Provisional application No. 61/740,429, filed on Dec. 20, 2012.

(51) Int. Cl.
*G06F 1/20* (2006.01)
*H05K 7/20* (2006.01)

(52) U.S. Cl.
CPC ............ *G06F 1/203* (2013.01); *H05K 7/20145* (2013.01)

(58) Field of Classification Search
CPC ..... H01L 23/467; H01L 23/427; G06F 1/203; G06F 1/20; G06F 1/206; H05K 7/20172; H05K 7/20727; H05K 7/20745; H05K 7/20836; H05K 7/20154; H05K 7/20563; H05K 7/20736; H05K 7/20136; H05K 7/20145; H05K 7/20572; H05K 7/2019; H05K 7/206; H05K 7/20; H05K 7/20972; H05K 7/20009
USPC .......................... 361/679.48–679.51, 690–698
See application file for complete search history.

(56) References Cited

U.S. PATENT DOCUMENTS 5,838,066 A * 11/1998 Kitajo .................... H01L 23/467
257/712
5,896,917 A *  4/1999 Lemont .................... H01L 23/38
165/125

(Continued)

*Primary Examiner* — Adam B Dravininkas
(74) *Attorney, Agent, or Firm* — Jianq Chyun IP Office

(57) ABSTRACT

An electronic apparatus includes a casing, a fan module, and at least one reinforcing structure. The casing includes a lateral side. The fan module is located in the casing. The reinforcing structure is located in the casing and between the lateral side and the fan module, and the reinforcing structure serves to enhance the support strength of the casing between the lateral side and the fan module.

6 Claims, 5 Drawing Sheets

(56) References Cited

U.S. PATENT DOCUMENTS

| | | | | |
|---|---|---|---|---|
| 7,561,417 B2* | 7/2009 | Hung | F28D 15/0233 | 165/104.33 |
| 2003/0007327 A1* | 1/2003 | Fujiwara | G06F 1/203 | 361/697 |
| 2003/0235035 A1* | 12/2003 | Wintersteen | H05K 7/20736 | 361/679.49 |
| 2005/0058543 A1* | 3/2005 | Takeshita | F04D 29/281 | 415/206 |
| 2005/0249587 A1* | 11/2005 | Paulsen | H05K 7/20172 | 415/146 |
| 2007/0047200 A1* | 3/2007 | Huang | G06F 1/20 | 361/695 |
| 2007/0131409 A1* | 6/2007 | Asahi | G05D 23/19 | 165/287 |
| 2007/0204976 A1* | 9/2007 | Uchimura | H01L 23/467 | 165/122 |
| 2008/0037219 A1* | 2/2008 | Chen | H05K 7/20909 | 361/695 |
| 2008/0151500 A1* | 6/2008 | Liang | H05K 7/20154 | 361/697 |
| 2009/0059525 A1* | 3/2009 | Peng | H01L 23/427 | 361/697 |
| 2009/0215380 A1* | 8/2009 | Lin | F04D 25/0613 | 454/184 |
| 2012/0026677 A1* | 2/2012 | Bhutani | F04D 25/0613 | 361/679.48 |
| 2012/0175079 A1* | 7/2012 | Chang | F04D 29/441 | 165/96 |
| 2012/0229982 A1* | 9/2012 | Hata | G06F 1/203 | 361/697 |
| 2012/0301281 A1* | 11/2012 | Wang | F04D 29/4226 | 415/182.1 |
| 2012/0314366 A1* | 12/2012 | Noborio | G06F 1/1658 | 361/692 |

* cited by examiner

ELECTRONIC DEVICE HAVING FAN MODULE WITH REINFORCING STRUCTURE

CROSS-REFERENCE TO RELATED APPLICATION

This application claims the priority benefits of U.S. provisional application Ser. No. 61/740,429, filed on Dec. 20, 2012. The entirety of the above-mentioned patent applications is hereby incorporated by reference herein and made a part of this specification.

FIELD OF THE INVENTION

The invention relates to an electronic apparatus; more particularly, the invention relates to an electronic apparatus characterized by favorable support strength and high heat dissipation efficiency without occupying significant space.

DESCRIPTION OF RELATED ART

At present, a fan module is usually arranged inside a casing of an electronic apparatus (e.g., a notebook computer), and an air flow channel is configured between the fan module and a ventilation opening of the casing, so as to dissipate heat within the electronic apparatus through convection. In addition to the circuit board and other electronic components, support walls and reinforcing structures for providing the support strength are often configured in the casing of the electronic apparatus; thereby, there is almost no room within the casing for air to flow. For instance, in a notebook computer, the keypad region and the palm-rest region located at the base require additional support strength; in response thereto, the air flow channel has to bypass the support walls and the reinforcing structures and is thus elongated.

SUMMARY OF THE INVENTION

The invention is directed to an electronic apparatus capable of providing sufficient support strength and favorable heat convection efficiency without occupying significant space.

In an embodiment of the invention, an electronic apparatus that includes a casing, a fan module, and at least one reinforcing structure is provided. The casing includes a lateral side. The fan module is located in the casing. The reinforcing structure is located in the casing and between the lateral side and the fan module, and the reinforcing structure serves to enhance the support strength of the casing between the lateral side and the fan module.

According to an embodiment of the invention, the casing includes a ventilation opening, the reinforcing structure has a slot, and an air flow channel is formed among the ventilation opening, the slot, and the fan module.

According to an embodiment of the invention, the reinforcing structure has a first support wall, an extension direction of the first support wall is substantially perpendicular to the air flow channel, and the slot is located at the first support wall.

According to an embodiment of the invention, the reinforcing structure has a second support wall, and an extension direction of the second support wall is substantially parallel to the air flow channel.

According to an embodiment of the invention, the reinforcing structure has a third support wall close to the fan module, and a contour of the third support wall substantially conforms to an outer contour of the fan module.

According to an embodiment of the invention, the casing further includes a bottom board and a top board, and the reinforcing structure is connected to at least one of the bottom board and the top board.

According to an embodiment of the invention, a height of the slot is greater than or substantially equal to 2 mm.

According to an embodiment of the invention, a height of the reinforcing structure is greater than or substantially equal to 2 mm, and a thickness of the reinforcing structure is greater than or substantially equal to 0.8 mm.

According to an embodiment of the invention, the casing and the reinforcing structure are integrally formed.

As discussed above, in the electronic apparatus provided herein, the reinforcing structure is configured between the lateral side of the casing and the fan module, so as to provide the electronic apparatus with the sufficient support strength. Moreover, the slot located below the reinforcing structure and between the reinforcing structure and the bottom board allows air to flow through to the ventilation opening or to the fan module, thus constituting the air flow channel between the ventilation opening and the fan module. That is, parts of the air flow channel are overlapped with the reinforcing structure, and the air flow channel need not bypass the reinforcing structure nor occupies additional space within the casing. As a result, the electronic apparatus described herein is capable of providing sufficient support strength and favorable heat convection efficiency without occupying significant space. Besides, the air flow channel may be the shortest path between the ventilation opening of the casing and the fan module, such that the heat within the electronic apparatus may be dissipated in a rapid manner, i.e., favorable heat dissipation efficiency of the electronic apparatus can be guaranteed.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
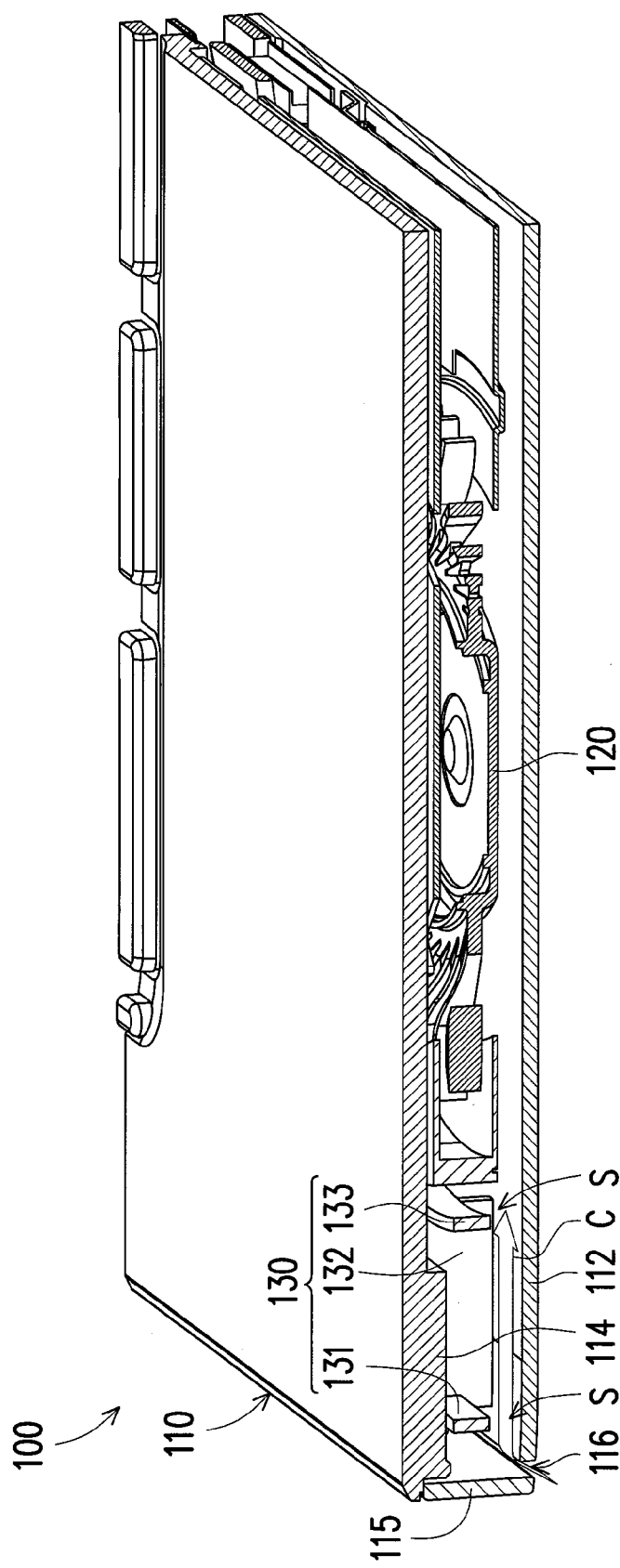
FIG. 1 is a schematic diagram illustrating a portion of an electronic apparatus according to an embodiment of the invention.
Figure 2:
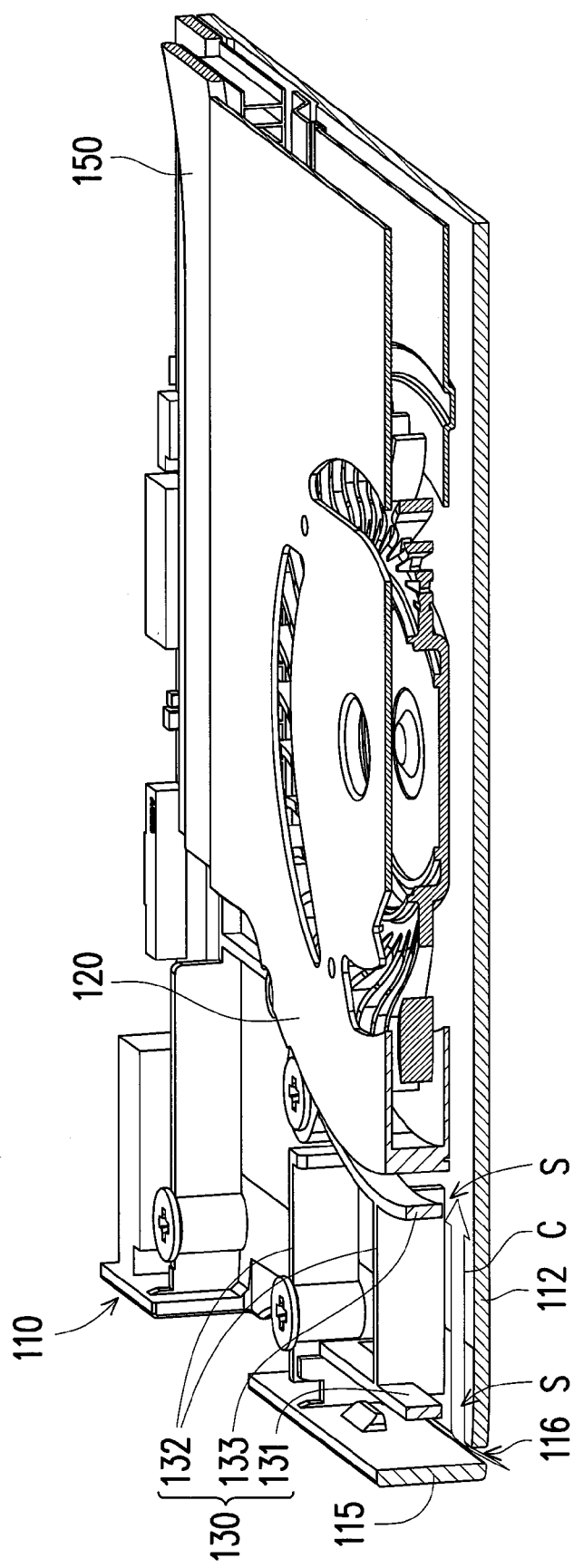
FIG. 2 is a schematic diagram illustrating the electronic apparatus depicted in FIG. 1 after the top board is removed.

FIG. 1 is a schematic diagram illustrating a portion of an electronic apparatus according to an embodiment of the invention. FIG. 2 is a schematic three-dimensional diagram illustrating the electronic apparatus depicted in FIG. 1 after the top board is removed. With reference to FIG. 1 and FIG.

2, the electronic apparatus 100 described in the present embodiment includes a casing 110, a fan module 120, and at least one reinforcing structure 130. In the present embodiment, the electronic apparatus 100 may be a thin and slim notebook computer. In FIG. 1, a portion of the keypad region and a portion of the palm-rest region are located at the left of the base of the notebook computer, whereas the type of the electronic apparatus 100 is not limited to that described herein.

The casing 110 includes a bottom board 112, a top board 114 opposite to the bottom board 112, a lateral side 115 between the bottom board 112 and the top board 114, and a ventilation opening 116 between the bottom board 112 and the lateral side 115. The fan module 120 is located in the casing 110. The reinforcing structure 130 is located in the casing 110 and between the lateral side 115 and the fan module 120, so as to enhance the support strength of the casing 110 between the lateral side 115 and the fan module 120.

In the present embodiment, the reinforcing structure 130 includes a first support wall 131, at least one second support wall 132, and a third support wall 133. Here, the first support wall 131 is close to the ventilation opening 116, and the third support wall 133 is close to the fan module 120. The number of at least one second support wall 132 may be plural, and the first support wall 131 and the third support wall 133 are respectively connected to at least parts of the second support walls 132.

The reinforcing structure 130 is connected to at least one of the bottom board 112 and the top board 114. In the present embodiment, the reinforcing structure 130 is connected to the bottom board 112. Specifically, the second support walls 132 of the reinforcing structure 130 are located within the casing 110 and connected to the bottom board 112.

Slots S are located close to the first support wall 131, the third support wall 133, and the bottom board 112, such that an air flow channel C is formed among the ventilation opening 116, each of the slots S, and the fan module 120.

As shown in FIG. 1 and FIG. 2, air outside the casing may flow along the air flow channel C from the ventilation opening 116 to the fan module 120 through the slots S below the reinforcing structure 130. In the present embodiment, the air flow channel C is substantially the shortest path between the ventilation opening 116 and the fan module 120. Hence, the heat inside the electronic apparatus 100 travels a relatively short distance and is then dissipated out of the casing 110. Certainly, in other embodiments, the location of the reinforcing structure 130 in the casing may be adjusted by the manufacturers, and the air flow channel C may not be the shortest path between the ventilation opening 116 and the fan module 120. As long as the reinforcing structure 130 is located between the ventilation opening 116 and the fan module 120, the reinforcing structure 130 does not depart from the scope of the invention.

In the electronic apparatus 100 described herein, the reinforcing structure 130 is configured between the lateral side 115 and the fan module 120, so as to provide sufficient support strength of the casing 110 between the lateral side 115 and the fan module 120. Moreover, due to the design of the slots S located below the reinforcing structure 130, the air flow channel C between the ventilation opening 116 and the fan module 120 is constituted, thus enhancing the heat dissipation efficiency within the casing 110.

In addition, the slots S below the reinforcing structure 130 act as parts of the air flow channel C in the electronic apparatus 100 described herein; namely, parts of the air flow channel C are overlapped with the reinforcing structure 130. Hence, the air flow channel C need not bypass the reinforcing structure 130 nor occupies additional internal space of the casing, which contributes to the space utilization within the electronic apparatus 100.

To ensure the favorable air convection within the casing 100, the height of each of the slots S is greater than or substantially equal to 2 mm. Further, to guarantee the support capability of the reinforcing structure 130, the height of the reinforcing structure 130 is greater than or substantially equal to 2 mm, and the thickness of the reinforcing structure 130 is greater than or substantially equal to 0.8 mm. Certainly, in other embodiments, manufacturers may take the dimension of the electronic apparatus 100 into consideration and may correspondingly increase or decrease the height of the slots S and the dimension of the reinforcing structure 130. Besides, manufacturers may selectively adjust the height of the reinforcing structure 130, such that the top board 114 leans against the reinforcing structure 130, and that the support strength of the casing 110 may be enhanced.

Figure 3:
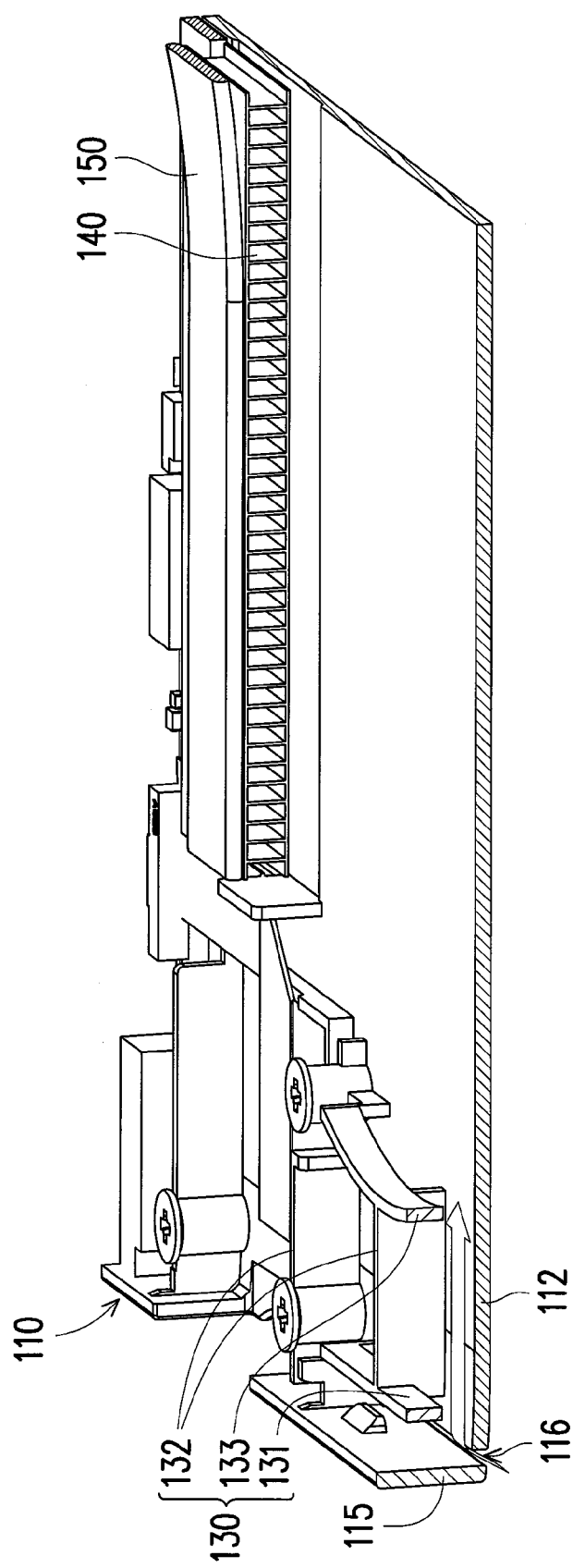
FIG. 3 is a schematic diagram illustrating the electronic apparatus depicted in FIG. 2 after the fan module is removed.

FIG. 3 is a schematic diagram illustrating the electronic apparatus depicted in FIG. 2 after the fan module is removed. With reference to FIG. 2 and FIG. 3, in the present embodiment, the electronic apparatus 100 further includes a heat dissipation fin 140 and a heat pipe 150. The heat dissipation fin 140 is located on the bottom board 112 and at one side of the fan module 120, and the heat pipe 150 is in contact with the heat dissipation fin 140. The heat dissipation fin 140 may be in contact with a heat source (not shown), so as to take away the heat from the heat source through heat conduction. Parts of the heat are transmitted to the heat pipe 150, and the other parts of the heat are taken away by the cool air from the fan module 120 to the heat dissipation fin 140. The heat pipe 150 has two-phase fluid, e.g., water or coolant, and the heat pipe 150 may be applied to reduce the temperature through phase change.

Figure 4:
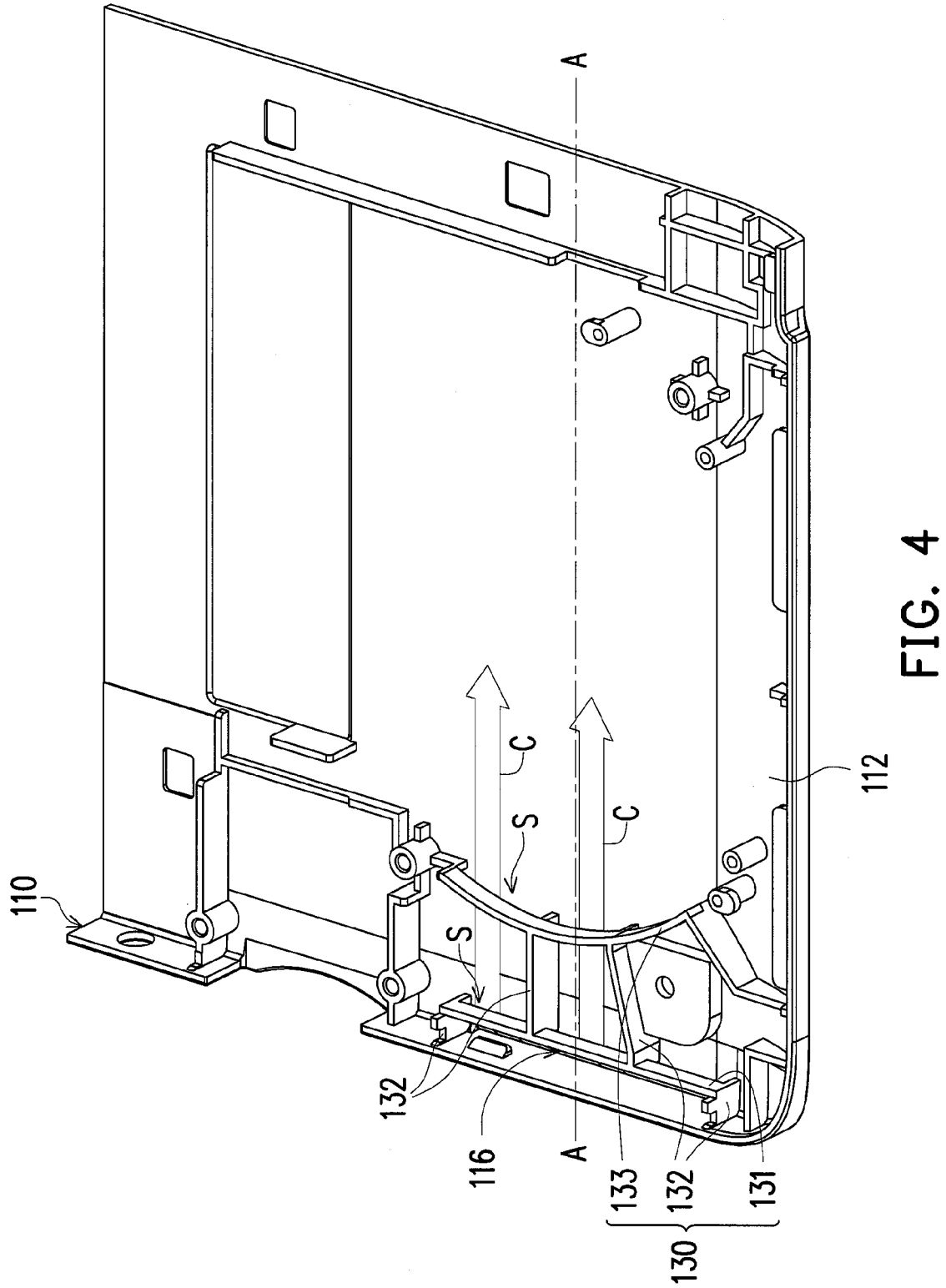
FIG. 4 is a schematic diagram illustrating the bottom board, the support walls, and the reinforcing structure of the electronic apparatus depicted in FIG. 1.
Figure 5:
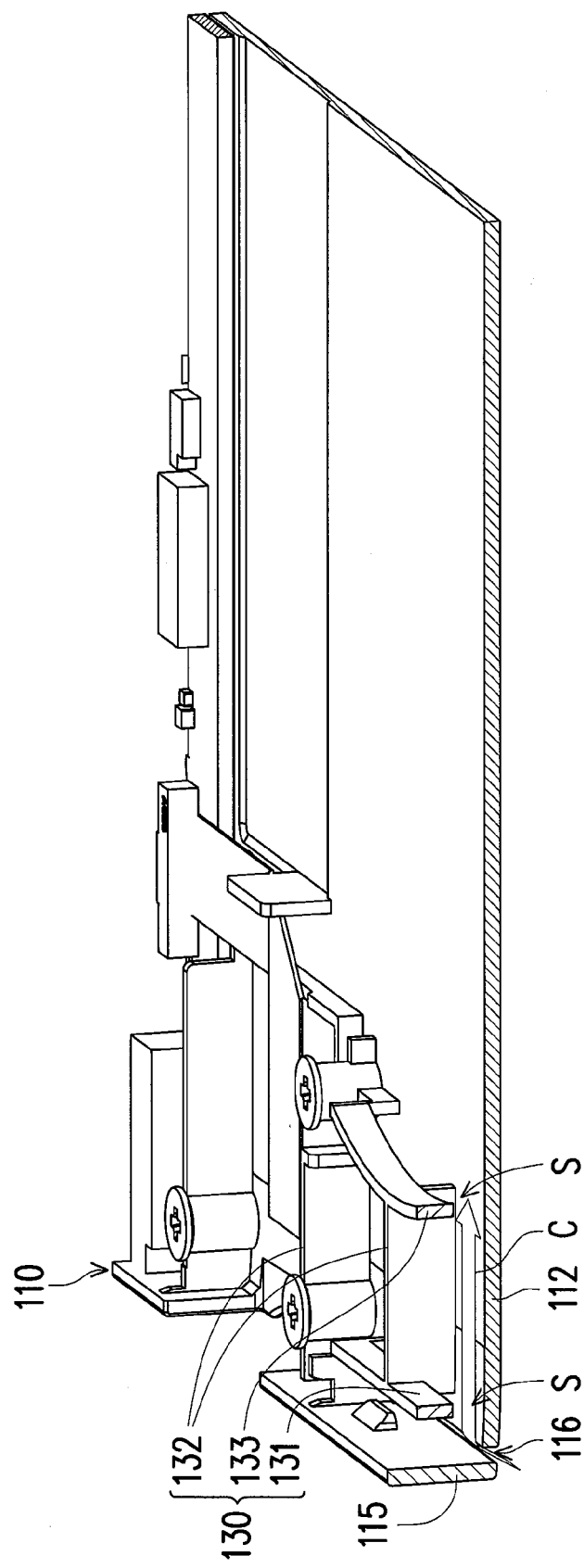
FIG. 5 is a schematic diagram illustrating a cross-section of the bottom board, the support walls, and the reinforcing structure of the electronic apparatus depicted in FIG. 4 along a sectional line A-A.

FIG. 4 is a schematic diagram illustrating the bottom board, the support walls, and the reinforcing structure of the electronic apparatus depicted in FIG. 1. FIG. 5 is a schematic diagram illustrating a cross-section of the bottom board, the support walls, and the reinforcing structure of the electronic apparatus depicted in FIG. 4 along a sectional line A-A. With reference to FIG. 4 and FIG. 5, in the present embodiment, an extension direction of the first support wall 131 is substantially perpendicular to the air flow channel C. The two ends of the first support wall 131 are respectively connected to two second support walls 132, and extension directions of the two second support walls (connected to the two ends of the first support wall 131) are substantially parallel to the air flow channel C.

In addition, a contour of the third support wall 133 substantially conforms to an outer contour of the fan module 120; that is, the third support wall 133 has an arc-shaped contour protruding toward the first support wall 131. Two second support walls 132 are connected to the first support wall 131 and the third support wall 133. The second support walls 132 can not only ensure the sufficient support strength of the casing 110 but also guide the air flow after the air enters the casing 110.

In the present embodiment, after the air outside the casing 110 enters the casing 110 from the ventilation opening 116, the air flows along the second support walls 132 to the fan module 120 through the slots S below the reinforcing structure 130. The direction of the air flow is not limited to the above and may be opposite to the above, i.e., the air may flow from the fan module 120 to the ventilation opening 116 through the slots S and then leave the casing 110.

Besides, the casing 110 and the reinforcing structure 130 are made of metal, and the bottom board 112 of the casing 110 and the reinforcing structure 130 may be integrally formed according to the present embodiment.

Particularly, the bottom plate 112 and the reinforcing structure 130 may be made of aluminum-magnesium alloy. To manufacture the casing 110 and the reinforcing structure 130, an injection molding process may be performed to inject the bottom board 112, the second support walls 132, and the non-finished first and third support walls 131 and 133. At this time, the non-finished first and third support walls 131 and 133 are still connected to the bottom board 112. A computer numerical control (CNC) milling machine along with a T-shaped cutting tool may be applied to mill the slots S between the first and third support walls 131 and 133 and the bottom board 112.

However, in other embodiments, the bottom plate 112 and the reinforcing structure 130 may be made of other metallic materials (e.g., aluminum alloy) or plastic materials. In the event that the bottom plate 112 and the reinforcing structure 130 are made of plastic materials, the bottom plate 112 and the reinforcing structure 130 may be formed by injection molding. Alternatively, if the casing 110 and the reinforcing structure 130 are respectively made of different materials, the reinforcing structure 130 may be fixed to the casing 110 through thermal compression. Note that the material and the way to manufacture the casing 110 and the reinforcing structure 130 are not limited to the above.

To sum up, in the electronic apparatus provided herein, the reinforcing structure is configured between the lateral side of the casing and the fan module, so as to provide the electronic apparatus with the sufficient support strength. Moreover, the slots located below the reinforcing structure and between the reinforcing structure and the bottom board allow air to flow through to the ventilation opening or to the fan module, thus constituting the air flow channel between the ventilation opening and the fan module. That is, parts of the air flow channel are overlapped with the reinforcing structure, and the air flow channel need not bypass the reinforcing structure nor occupies additional space within the casing. As a result, the electronic apparatus described herein is capable of providing sufficient support strength and favorable heat convection efficiency without occupying significant space. Besides, the air flow channel may be the shortest path between the ventilation opening of the casing and the fan module, such that the heat within the electronic apparatus may be dissipated in a rapid manner, i.e., favorable heat dissipation efficiency of the electronic apparatus can be guaranteed.

Although the disclosure has been described with reference to the above embodiments, it will be apparent to one of ordinary skill in the art that modifications to the described embodiment may be made without departing from the spirit of the disclosure. Accordingly, the scope of the disclosure will be defined by the attached claims not by the above detailed descriptions.

What is claimed is:

1. An electronic apparatus comprising:
   a casing comprising a lateral side;
   a fan module located in the casing;
   a reinforcing structure located in the casing and between the lateral side and the fan module, the reinforcing structure contacting the casing directly so as to enhance a support strength of the casing between the lateral side and the fan module, wherein the reinforcing structure has a slot, and the slot is located between the reinforcing structure and a bottom board of the casing; and
   wherein the casing comprises a ventilation opening, and an air flow channel is formed among the ventilation opening, the slot, and the fan module;
   wherein the reinforcing structure has a first support wall, an extension direction of the first support wall is substantially perpendicular to the air flow channel, and the slot is located at the first support wall; and
   wherein the reinforcing structure has a second support wall, and an extension direction of the second support wall is substantially parallel to the air flow channel.

2. The electronic apparatus as recited in claim 1, wherein the reinforcing structure has a third support wall close to the fan module, and a contour of the third support wall substantially conforms to an outer contour of the fan module.

3. The electronic apparatus as recited in claim 1, wherein the casing further comprises a bottom board and a top board, and the reinforcing structure is connected to at least one of the bottom board and the top board.

4. The electronic apparatus as recited in claim 1, wherein a height of the slot is greater than or substantially equal to 2 mm.

5. The electronic apparatus as recited in claim 1, wherein a height of the reinforcing structure is greater than or substantially equal to 2 mm, and a thickness of the reinforcing structure is greater than or substantially equal to 0.8 mm.

6. The electronic apparatus as recited in claim 1, wherein the casing and the reinforcing structure are integrally formed.

* * * * *